United States Patent
Negley et al.

(10) Patent No.: US 8,123,375 B2
(45) Date of Patent: Feb. 28, 2012

(54) TILE FOR SOLID STATE LIGHTING

(75) Inventors: Gerald H. Negley, Durham, NC (US); Paul E. Sims, Pittsboro, NC (US); Ban P. Loh, Durham, NC (US)

(73) Assignee: Cree, Inc., Durham, NC (US)

( * ) Notice: Subject to any disclaimer, the term of this patent is extended or adjusted under 35 U.S.C. 154(b) by 56 days.

(21) Appl. No.: 12/093,698

(22) PCT Filed: Nov. 17, 2006

(86) PCT No.: PCT/US2006/044519
§ 371 (c)(1), (2), (4) Date: Nov. 12, 2008

(87) PCT Pub. No.: WO2007/061758
PCT Pub. Date: May 31, 2007

(65) Prior Publication Data
US 2009/0219714 A1    Sep. 3, 2009

Related U.S. Application Data

(60) Provisional application No. 60/738,305, filed on Nov. 18, 2005, provisional application No. 60/749,133, filed on Dec. 9, 2005.

(51) Int. Cl.
*F21V 23/00* (2006.01)
(52) U.S. Cl. ............... 362/231; 362/249.02; 362/800
(58) Field of Classification Search .............. 362/231, 362/249.14, 249.02, 388, 249.01, 249.07
See application file for complete search history.

(56) References Cited

U.S. PATENT DOCUMENTS
4,329,625 A    5/1982    Nishizawa et al.
(Continued)

FOREIGN PATENT DOCUMENTS
FR    2 426 381    12/1979
(Continued)

OTHER PUBLICATIONS
Machine English translation of FR 2 426 381.*
(Continued)

*Primary Examiner* — Robert May
*Assistant Examiner* — Leah S Lovell
(74) *Attorney, Agent, or Firm* — Myers Bigel Sibley & Sajovec

(57) ABSTRACT

A solid state lighting tile (10) includes a substrate having a planar surface. A first plurality of solid state light emitting devices (LEDs) are on the substrate. The first plurality of LEDs (19) are connected in series to form a first string of LEDs of a first color having an anode contact (22) at a first end of the tile and a cathode contact (24) at a second end of the tile. A second plurality of LEDs are on the substrate. The second plurality of LEDs (21) are connected in series to form a second string of LEDs of the first color having a cathode contact (28) at the first end of the tile and an anode contact (26) at the second end of the tile.

11 Claims, 2 Drawing Sheets

U.S. PATENT DOCUMENTS

| | | | |
|---|---|---|---|
| 5,783,909 | A | 7/1998 | Hochstein |
| 5,959,316 | A | 9/1999 | Lowery |
| 6,078,148 | A | 6/2000 | Hochstein |
| 6,127,784 | A | 10/2000 | Grossman et al. |
| 6,153,985 | A | 11/2000 | Grossman |
| 6,236,331 | B1 | 5/2001 | Dussureault |
| 6,285,139 | B1 | 9/2001 | Ghanem |
| 6,350,041 | B1 | 2/2002 | Tarsa et al. |
| 6,362,578 | B1 | 3/2002 | Swanson et al. |
| 6,411,046 | B1 | 6/2002 | Muthu |
| 6,441,558 | B1 | 8/2002 | Muthu et al. |
| 6,495,964 | B1 | 12/2002 | Muthu et al. |
| 6,498,440 | B2 | 12/2002 | Stam et al. |
| 6,510,995 | B2 | 1/2003 | Muthu et al. |
| 6,576,881 | B2 | 6/2003 | Muthu et al. |
| 6,576,930 | B2 | 6/2003 | Reeh et al. |
| 6,630,801 | B2 | 10/2003 | Schuurmans |
| 6,674,060 | B2 | 1/2004 | Antila |
| 6,741,351 | B2 | 5/2004 | Marshall et al. |
| 6,809,347 | B2 | 10/2004 | Tasch et al. |
| 6,836,081 | B2 | 12/2004 | Swanson et al. |
| 6,841,804 | B1 | 1/2005 | Chen et al. |
| 6,841,947 | B2 | 1/2005 | Berg-johansen |
| 6,936,857 | B2 | 8/2005 | Doxsee et al. |
| 7,009,343 | B2 | 3/2006 | Lim et al. |
| 7,023,543 | B2 | 4/2006 | Cunningham |
| 7,135,664 | B2 | 11/2006 | Vornsand et al. |
| 7,140,752 | B2 | 11/2006 | Ashdown |
| 7,173,384 | B2 | 2/2007 | Plotz et al. |
| 7,186,000 | B2 | 3/2007 | Lebens et al. |
| 7,202,608 | B2 | 4/2007 | Robinson et al. |
| 7,208,713 | B2 | 4/2007 | Ishiguchi |
| 7,213,940 | B1 | 5/2007 | Van De Ven et al. |
| 7,256,557 | B2 | 8/2007 | Lim et al. |
| 7,614,759 | B2 | 11/2009 | Negley |
| 7,712,917 | B2 | 5/2010 | Roberts et al. |
| 7,718,991 | B2 | 5/2010 | Negley |
| 7,722,220 | B2 | 5/2010 | Van de Ven |
| 7,768,192 | B2 | 8/2010 | Van de Ven et al. |
| 2002/0190972 | A1 | 12/2002 | Ven de Van |
| 2003/0089918 | A1 | 5/2003 | Hiller et al. |
| 2006/0105482 | A1 | 5/2006 | Alferink et al. |
| 2007/0115228 | A1 | 5/2007 | Roberts et al. |
| 2007/0115662 | A1 | 5/2007 | Roberts et al. |
| 2007/0115670 | A1 | 5/2007 | Roberts et al. |
| 2007/0115671 | A1 | 5/2007 | Roberts et al. |
| 2007/0139923 | A1 | 6/2007 | Negley et al. |
| 2007/0170447 | A1 | 7/2007 | Negley |
| 2007/0171145 | A1 | 7/2007 | Coleman et al. |
| 2007/0216704 | A1 | 9/2007 | Roberts et al. |
| 2007/0247414 | A1 | 10/2007 | Roberts |
| 2007/0267983 | A1 | 11/2007 | Van de Ven et al. |
| 2007/0274080 | A1 | 11/2007 | Negley et al. |
| 2007/0278503 | A1 | 12/2007 | Van de Ven et al. |
| 2007/0278934 | A1 | 12/2007 | Van de Ven et al. |
| 2007/0279440 | A1 | 12/2007 | Negley |
| 2007/0279903 | A1 | 12/2007 | Negley et al. |
| 2007/0280624 | A1 | 12/2007 | Negley et al. |
| 2008/0084685 | A1 | 4/2008 | Van de Ven et al. |
| 2008/0084700 | A1 | 4/2008 | Van de Ven |
| 2008/0084701 | A1 | 4/2008 | Van de Ven et al. |
| 2008/0088248 | A1 | 4/2008 | Myers |
| 2008/0089053 | A1 | 4/2008 | Negley |
| 2008/0106895 | A1 | 5/2008 | Van de Ven et al. |
| 2008/0106907 | A1 | 5/2008 | Trott et al. |
| 2008/0112168 | A1 | 5/2008 | Pickard et al. |
| 2008/0112170 | A1 | 5/2008 | Trott et al. |
| 2008/0112183 | A1 | 5/2008 | Negley |
| 2008/0130285 | A1 | 6/2008 | Negley et al. |
| 2008/0136313 | A1 | 6/2008 | Van de Ven et al. |
| 2008/0137347 | A1 | 6/2008 | Trott et al. |
| 2008/0191643 | A1 | 8/2008 | Roberts et al. |
| 2008/0278950 | A1 | 11/2008 | Pickard et al. |
| 2008/0278952 | A1 | 11/2008 | Trott et al. |
| 2008/0278957 | A1 | 11/2008 | Pickard et al. |
| 2008/0304261 | A1 | 12/2008 | Van de Ven et al. |
| 2008/0304269 | A1 | 12/2008 | Pickard et al. |
| 2008/0309255 | A1 | 12/2008 | Myers et al. |
| 2009/0033612 | A1 | 2/2009 | Roberts et al. |
| 2009/0040674 | A1 | 2/2009 | Roberts et al. |
| 2009/0108269 | A1 | 4/2009 | Negley et al. |
| 2009/0153450 | A1 | 6/2009 | Roberts et al. |
| 2009/0184616 | A1 | 7/2009 | Van de Ven et al. |
| 2009/0184666 | A1 | 7/2009 | Myers et al. |

FOREIGN PATENT DOCUMENTS

| | | |
|---|---|---|
| JP | 09199756 | 7/1997 |
| JP | 2001 024235 A | 1/2001 |
| JP | 2001024235 | 1/2001 |
| JP | 2002372927 | 12/2002 |
| JP | 2005026619 | 1/2005 |
| WO | WO 96/18210 A1 | 6/1996 |
| WO | WO 2004/032235 A2 | 4/2004 |
| WO | WO 2004/071141 A2 | 8/2004 |
| WO | WO 2007/061758 A1 | 5/2007 |

OTHER PUBLICATIONS

Machine English translation of WO 2004/032235.*

U.S. Appl. No. 11/755,149, filed May 30, 2007, Van De Ven.

U.S. Appl. No. 12/257,804, filed Oct. 24, 2008, Negley.

Perduijn et al, "Light Output Feedback Solution for RGB LED Backlight Applications", SID 2003 Digest 43.2/A.

Zhu et al., "Optimizing the Performance of Remote Phosphor LED, First International Conference on White LEDs and Solid State Lighting", 5 pages, Japan (Nov. 26-30, 2007).

International Search Report and Written Opinion (9 pages) corresponding to International Application No. PCT/US07/12707; Mailing Date: Aug. 21, 2008.

International Search Report and Written Opinion for International Application No. PCT/US2006/044519, Mailed Mar. 28, 2007.

U.S. Appl. No. 60/990,724, filed Nov. 28, 2007, First named inventor: Gerald H. Negley.

U.S. Appl. No. 61/041,404, filed Apr. 1, 2008, First named inventor: Gerald H. Negley.

U.S. Appl. No. 61/108,133, filed Oct. 24, 2008, First named inventory: Gerald H. Negley.

Kaito, Noboru, "Luxeon Backlight Electronics Complementary Infrastucture Program for Partners", Luxeon BL ECI Program for Partners, Sep. 14, 2004, 19 pages.

* cited by examiner

TILE FOR SOLID STATE LIGHTING

CROSS-REFERENCE TO RELATED APPLICATIONS

This application claims the benefit of and priority to U.S. Provisional Patent Application No. 60/738,305 entitled "SYSTEM AND METHOD FOR INTERCONNECTION AND INTEGRATION OF LED BACKLIGHTING MODULES" filed Nov. 18, 2005, and U.S. Provisional Patent Application No. 60/749,133 entitled "SOLID STATE BACKLIGHTING UNIT ASSEMBLY AND METHODS" filed Dec. 9, 2005, the disclosures of which are hereby incorporated herein by reference as if set forth in their entirety.

FIELD OF THE INVENTION

The present invention relates to solid state lighting, and more particularly to components for solid state lighting units.

BACKGROUND

Solid state lighting panels may be used as solid state backlight units for displays, as lighting panels for general illumination, as backlights for signage, and/or for other purposes. Solid state backlighting units for LCD displays typically include a two dimensional array of discrete light sources arranged behind an LCD screen. The discrete light sources may generate light having a white or near-white color that may be used to illuminate an LCD display, such as a full-color LCD display. In order for the LCD display to display an image on the screen having uniform color and/or intensity, it may be desirable for the backlight unit to provide a light to the LCD screen that is spatially uniform, both in color and intensity. This may be difficult, however, as the discrete light sources may be spaced apart from each other in the backlight unit. In particular, as the brightness of solid state light sources increases, it may be desirable to arrange the light sources with a larger and larger pitch between sources, for example, in order to reduce heat dissipation and/or to increase the efficiency of the display.

Similar problems relating to color uniformity, efficiency and/or heat dissipation may arise when solid state lighting units including arrays of solid state light emitting devices are used for general illumination.

SUMMARY

A solid state lighting tile according to some embodiments of the invention includes a substrate having a planar surface. A first plurality of solid state light emitting devices (LEDs) are on the substrate. The first plurality of LEDs are connected in series to form a first string of LEDs of a first color having an anode contact at a first end of the tile and a cathode contact at a second end of the tile. A second plurality of LEDs are on the substrate. The second plurality of LEDs are connected in series to form a second string of LEDs of the first color having a cathode contact at the first end of the tile and an anode contact at the second end of the tile.

The solid state lighting tile may further include a loopback connector that electrically connects the cathode contact of the first string to the anode contact of the second string so that the first string and the second string form a single string having an anode contact and a cathode contact on the first end of the tile.

The solid state light emitting devices may include solid state light emitting diodes arranged in a plurality of clusters. Each cluster may include solid state light emitting diodes configured to emit at least two different colors. A respective one of the clusters may include a substrate and a plurality of LED chips mounted on the substrate. In some embodiments, a respective one of the clusters may include a plurality of LED chips mounted on respective traces on the substrate and an encapsulant material on the plurality of LED chips. The substrate may include an FR-4 printed circuit board (PCB) and/or a metal core PCB.

The solid state lighting tile may further include a plurality of first strings of series-connected LEDs, the first strings having respective anode contacts at a first end of the tile and cathode contacts at a second end of the tile opposite the first end, and a plurality of second strings of series-connected LEDs, the second strings having respective anode contacts at the second end of the tile and cathode contacts at the first end of the tile. At least one of the first strings and at least one of the second strings may include electrical test pads between a pair of adjacent LEDs.

Each of the plurality of first strings and the plurality of second strings may include at least a first color string of LEDs configured to emit light having a first wavelength when energized, and a second color string of LEDs configured to emit light having a second wavelength when energized.

The tile may have a longitudinal center axis, and the first plurality of strings and the second plurality of strings may run generally parallel to the longitudinal center axis. The anode and cathode contacts of the first color string of the first plurality of strings and the anode and cathode contacts of the first color string of the second plurality of strings may be disposed nearer to the longitudinal center axis of the tile than the anode and cathode contacts of the second color string of the first plurality of strings and the anode and cathode contacts of second color string of the second plurality of strings.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1:
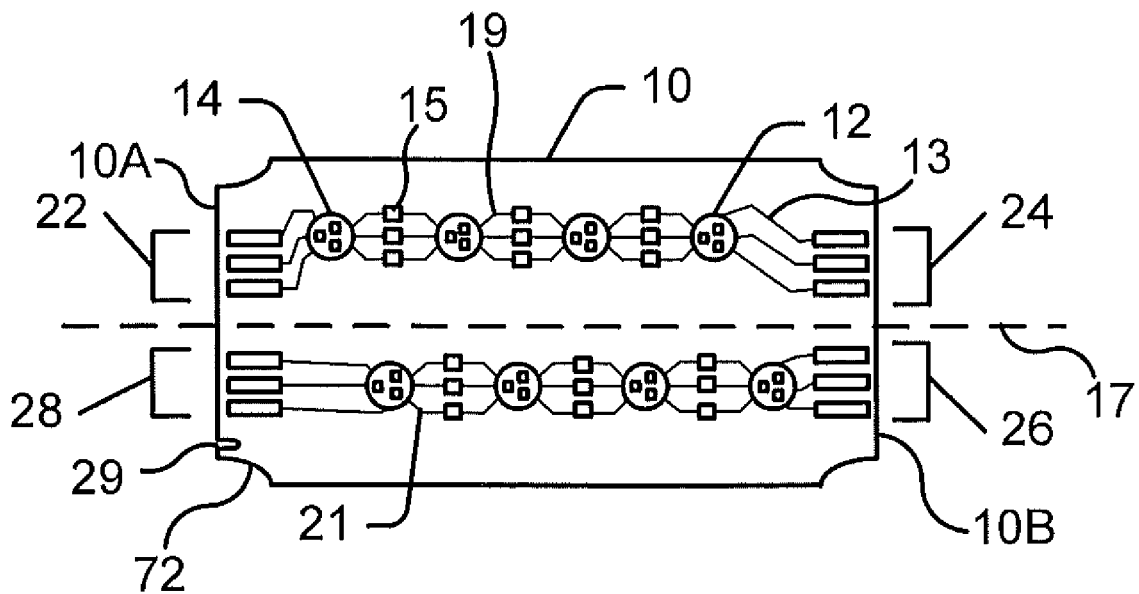
FIG. 1 is a plan view illustration of a tile for a solid state lighting unit according to some embodiments of the invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes," and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Referring now to FIG. 1, a solid state lighting tile 10 for use in a solid state lighting unit may include thereon a number of solid state lighting element clusters 12 arranged in a regular and/or irregular two dimensional array. The tile 10 may include, for example, a printed circuit board (PCB) on which one or more circuit elements may be mounted. In particular, a tile 10 may include a metal core PCB (MCPCB) including a metal core having thereon a polymer coating on which patterned metal traces 13 may be formed. MCPCB material, and material similar thereto, is commercially available from, for example, The Bergquist Company. The PCB may further include heavy clad (4 oz. copper or more) and/or conventional FR-4 PCB material with thermal vias. MCPCB material may provide improved thermal performance compared to conventional PCB material. However, MCPCB material may also be heavier than conventional PCB material, which may not include a metal core.

In the embodiments illustrated in FIG. 1, the lighting element clusters 12 are multi-chip clusters of three solid state emitting devices per cluster. In the tile 10, four lighting element clusters 12 are serially arranged in a first path 19, while four lighting element clusters 12 are serially arranged in a second path 21. The lighting element clusters 12 of the first path 19 are connected, for example via electrical traces 13, to a set of three anode contacts 22 arranged at a first end 10A of the tile 10, and a set of three cathode contacts 24 arranged at a second end 10B of the tile 10. The lighting element clusters 12 of the second path 21 are connected to a set of three anode contacts 26 arranged at the second end 10B of the tile 10, and a set of three cathode contacts 28 arranged at the first end 10A of the tile 10. The tile 10 may further include electrical test pads 15 between the lighting element clusters 12. The electrical test pads 15 are configured to permit individual testing of the light emitting devices of the lighting element clusters 12.

An alignment notch 29 may be provided in the tile 10 to assist connection of an edge connector (not shown) and also to prevent incorrect installation of the edge connector. Furthermore, notches 72 may be provided in the corners of the tiles 10 to avoid contact between the tile 10 and screws of a support member (not shown) on which the tile 10 is mounted. The tile 10 may further include one or more automation indexing holes (not shown) that may be used to move the tile 10 during automated manufacturing steps.

Figure 2:
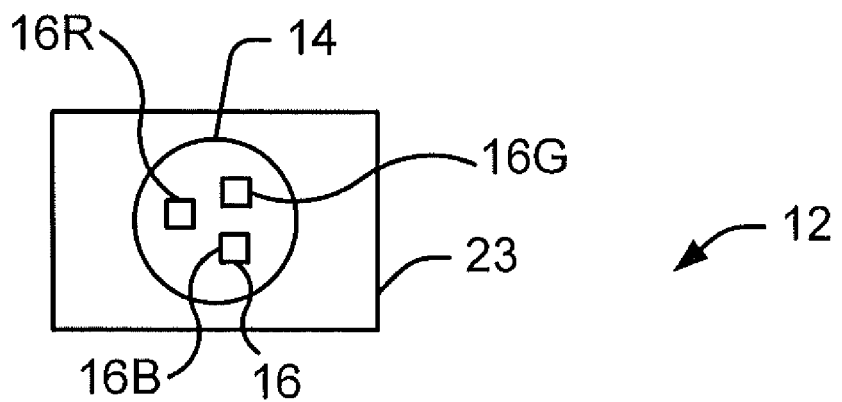
FIG. 2 is a plan view illustration of a solid state light source for a solid state lighting unit according to some embodiments of the invention.

The solid state lighting element clusters 12 may include, for example, organic and/or inorganic light emitting devices. An example of a solid state lighting element cluster 12 for high power illumination applications is illustrated in FIG. 2. A solid state lighting element cluster 12 may include a packaged discrete electronic component including a carrier substrate 23 on which a plurality of LED chips 16 are mounted. In other embodiments, one or more solid state lighting element clusters 12 may include LED chips 16 mounted directly onto electrical traces on the surface of the tile 10, forming a multi-chip module or chip-on-board assembly.

The LED chips 16 may include at least a red LED 16R, a green LED 16G and a blue LED 16B. The blue and/or green LEDs may include InGaN-based blue and/or green LED chips available from Cree, Inc., the assignee of the present invention. The red LEDs may be, for example, AlInGaP LED chips available from Epistar, Osram and others. The lighting device 12 may include an additional green LED in order to make more green light available.

In some embodiments, the LEDs 16 may have a square or rectangular periphery with an edge length of about 900 µm or greater (i.e. so-called "power chips." However, in other embodiments, the LED chips 16 may have an edge length of 500 µm or less (i.e. so-called "small chips"). In particular, small LED chips may operate with better electrical conversion efficiency than power chips. For example, green LED chips with a maximum edge dimension less than 500 microns, and as small as 260 microns, commonly have a higher electrical conversion efficiency than 900 micron chips, and are known to typically produce 55 lumens of luminous flux per Watt of dissipated electrical power and as much as 90 lumens of luminous flux per Watt of dissipated electrical power.

As further illustrated in FIG. 2, the LEDs 16 may be covered by an encapsulant dome 14, which may be clear and/or may include light scattering particles, phosphors, and/or other elements to achieve a desired emission pattern, color and/or intensity. The encapsulant dome 14, which may include a curable epoxy resin, may provide mechanical and/or environmental protection for the LEDs 16. While not illustrated in FIG. 2, the lighting element cluster 12 may further include a reflector cup surrounding the LEDs 16, a lens mounted above the LEDs 16, one or more heat sinks for removing heat from the lighting device, an electrostatic discharge protection chip, and/or other elements.

Figure 3:
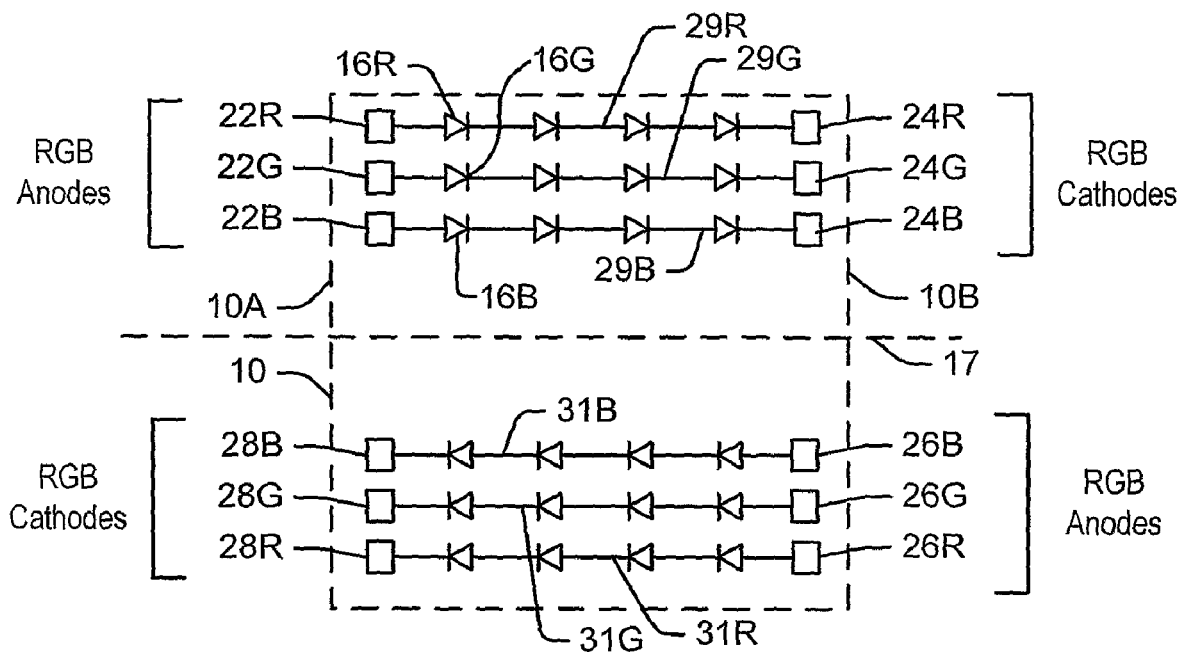
FIG. 3 is a circuit diagram illustrating the electrical interconnection of light sources on a tile according to some embodiments of the invention.

The LED chips 16 of the lighting element clusters 12 in the tile 10 may be electrically interconnected as shown in the schematic circuit diagram in FIG. 3. As shown therein, the LEDs 16 may be interconnected such that the blue LEDs 16B in the first path 19 are connected in series to form a string 30B. Likewise, the green LEDs 16G in the first path 19 may be arranged in series to form a string 30G. The red LEDs 16R may be arranged in series to form a string 30R. Each string 30R, 30G, 30B may be connected to a respective anode contact 22R, 22G, 22B arranged at a first end of the tile 10 and a cathode contact 24 arranged at the second end of the tile 10, respectively.

A string 30R, 30G, 30B may include all, or less than all, of the corresponding LEDs in the first path 19. For example, the string 30B may include all of the blue LEDs 16B from all of the lighting element clusters 12 in the first path 19. Alternatively, a string 30R, 30G, 30B may include only a subset of the corresponding LEDs in the first path 19. Accordingly the first path 19 may include three strings 30R, 30G, 30B arranged in parallel on the tile 10.

The second path 21 on the tile 10 may include three strings 31R, 31G, 31B arranged in parallel. The strings 31R, 31G, 31B are connected to anode contacts 26R, 26G, 26B, which are arranged at the second end of the tile 10 and to cathode contacts 28R, 28G, 28B, which are arranged at the first end of the tile 10, respectively.

The first group of strings 30R, 30G, 30B have anode contacts 22R, 22G and 22B generally adjacent a first end 10A of the tile 10 and cathode contacts 24R, 24G, 24B generally adjacent a second end 10B of the tile 10. The second group of strings 31R, 31G, 31B have anode contacts 26R, 26G and 26B generally adjacent the second end 10B of the tile 10 and cathode contacts 28R, 28G, 28B generally adjacent the first end 10A of the tile 10.

As shown in FIGS. 1 and 3, The tile 10 may have a longitudinal center axis 17, and the first group of strings 30R, 30G, 30B and the second group of strings 31R, 31G, 31B may run generally parallel to the longitudinal center axis 17.

The anode and cathode contacts of a first color string of the first group of strings and the anode and cathode contacts of the first color string of the second group of strings may be disposed nearer to the longitudinal center axis 17 of the tile 10 than the anode and cathode contacts of the second and/or third color strings of the first and second groups of strings. For example, the anode and cathode contacts 22B, 24B, 26B, 28B of the blue strings 30B and 31B may be disposed closer to the longitudinal center axis 17 than the anode and cathode contacts 22G, 24G, 26G, 28G of the green strings 30G and 31G. Likewise, the anode and cathode contacts 22G, 24G, 26G, 28G of the green strings 30G and 31G may be disposed closer to the longitudinal center axis 17 than the anode and cathode contacts 22R, 24R, 26R, 28R of the red strings 30R and 31R.

The cathode contact of a first color string of the first group of strings and the anode contact of the first color string of the second group of strings may be offset in a direction parallel to the longitudinal center axis 17 of the tile 10 from the cathode contact of a second color string of the first group of strings and the anode contact of the second color string of the second group of strings. In particular, the cathode contact of the first color string of the first group of strings and the anode contact of the first color string of the second group of strings may be farther from an end 10A, 10B of the tile 10 than the cathode contact of the second color string of the first group of strings and the anode contact of the second color string of the second group of strings.

For example as shown in FIG. 3, the cathode contact 24B of the blue string 30B and the anode contact 26B of the blue string 31B may be disposed farther from the end 10B of the tile 10 than the cathode contact 24G of the green string 30G and the anode contact 26G of the green string 31G. Staggering the contacts from the end 10B of the tile 10 may facilitate connecting the contacts of the respective strings, for example to form a loopback connector using wire loops.

It will be appreciated that, while the embodiments illustrated in FIGS. 1-3 include three LED chips 16 per cluster 12 which are electrically connected to form at least three strings of LEDs 16 per path 19, 21, more and/or fewer than three LED chips 16 may be provided per lighting device 12, and more and/or fewer than three LED strings may be provided per path 19, 21 on the tile 10. For example, a cluster 12 may include two green LED chips 16G, in which case the LEDs may be connected to form four strings per path 19, 21. Likewise, in some embodiments including two green LED chips per cluster 12, the two green LED chips in a cluster 12 may be connected in series to one another, in which case there may only be a single string of green LED chips per path 19, 21. Further, a tile 10 may include only a single path 19 instead of plural paths 19, 21 and/or more than two paths 19, 21 may be provided on a single tile 10.

Figure 4:
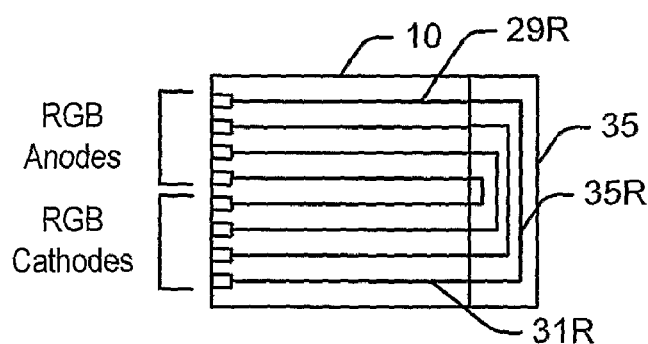
FIG. 4 is a plan view illustration of a tile including a loopback connector according to some embodiments of the invention.

Referring to FIGS. 1, 3 and 4, the cathode contacts 24 of the first path 19 of the tile 10 may be electrically connected to the anode contacts 26 of the second path 21 of the tile 10 by a loopback connector 35. For example, the loopback connector 35 may electrically connect the cathode 24R of the string 30R of red LED chips 16R of the first path 19 of the tile 10 with the anode 26R of the string 31R of red LED chips of the second path 21 of the tile 10. In this manner, the string 29R of the first path 19 may be connected in series with the string 31R of the second path 21 by a conductor 35R of the loopback connector 35 to form a single string of red LED chips 16R. The other strings of the paths 19, 21 of the tile 10 may be connected in a similar manner.

The loopback connector 35 may include an edge connector, a flexible wiring board, or any other suitable connector. In addition, the loop connector may include printed traces and/or wire loops formed on/in the tile 10.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A solid state lighting tile, comprising:
a substrate having a planar surface;
a first set of contact pads on a first end of the substrate and a second set of contact pads on a second end of the substrate, wherein the first set of contact pads comprises a first anode contact, a second cathode contact, a third anode contact and a fourth cathode contact, wherein the second set of contact pads comprises a first cathode contact, a second anode contact, a third cathode contact and a fourth anode contact, and wherein the first cathode contact and the second anode contact are between the third cathode contact and the fourth anode contact at the second end of the substrate;
a first plurality of solid state light emitting devices (LEDs) on the substrate, wherein the first plurality of LEDs are connected in series to form a first string of LEDs of a first color, the first string coupled to the first anode contact at a first end of the substrate and coupled to the first cathode contact at a second end of the substrate;

a second plurality of LEDs on the substrate, the second plurality of LEDs connected in series to form a second string of LEDs of the first color, the second string coupled to the second cathode contact at the first end of the substrate and coupled to the second anode contact at the second end of the substrate;

a third plurality of solid state light emitting devices (LEDs) on the substrate, wherein the third plurality of LEDs are connected in series to form a third string of LEDs of a second color different from the first color, the third string coupled to the third anode contact at the first end of the substrate and coupled to the third cathode contact at the second end of the substrate; and a fourth plurality of LEDs on the substrate, the fourth plurality of LEDs connected in series to form a fourth string of LEDs of the second color, the fourth string fourth cathode contact at the first end of the substrate and coupled to the fourth anode contact at the second end of the substrate.

2. The solid state lighting tile of claim 1, further comprising a loopback connector that electrically connects the first cathode contact of the first string to the second anode contact of the second string so that the first string and the second string form a first single string having a first string anode contact and a first string cathode contact on the first end of the substrate, wherein the loop back connector further electrically connects the third cathode contact of the third string to the fourth anode contact of the fourth string so that the third string and the fourth string form a second single string having a second string anode contact and a second string cathode contact on the first end of the substrate.

3. The solid state lighting tile of claim 1, wherein the solid state light emitting devices comprise solid state light emitting diodes arranged in a plurality of clusters.

4. The solid state lighting tile of claim 3, wherein each cluster comprises solid state light emitting diodes configured to emit at least two different colors.

5. The solid state lighting tile of claim 3, wherein a respective one of the clusters comprises a substrate and a plurality of LED chips mounted on the substrate.

6. The solid state lighting tile of claim 3, wherein a respective one of the clusters comprises a plurality of LED chips mounted on respective traces on the substrate and an encapsulant material on the plurality of LED chips.

7. The solid state lighting tile of claim 1, wherein the substrate comprises an FR-4 printed circuit board (PCB) and/or a metal core PCB.

8. A solid state lighting tile, comprising:
a substrate having a planar surface, a first end, and a second end opposite the first end;
a first set of contact pads on the first end of the substrate and a second set of contact pads on the second end of the substrate, wherein the first set of contact pads comprises a first anode contact, a second cathode contact, a third anode contact and a fourth cathode contact, wherein the second set of contact pads comprises a first cathode contact, a second anode contact, a third cathode contact and a fourth anode contact, and wherein the first cathode contact and the second anode contact are between the third cathode contact and the fourth anode contact at the second end of the substrate;
a plurality of first strings of series-connected LEDs on the surface of the substrate, the first strings coupled to respective ones of the anode contacts at the first end of the substrate and cathode contacts at the second end of the substrate; and
a plurality of second strings of series-connected LEDs, the second strings coupled to respective ones of the anode contacts at the second end of the substrate and cathode contacts at the first end of the substrate;
wherein each of the plurality of first strings and the plurality of second strings includes at least a first color string of LEDs configured to emit light having a first wavelength when energized, and a second color string of LEDs configured to emit light having a second wavelength when energized; and
wherein the first color string of LEDs of the plurality of first stings is coupled between the first anode contact and the first cathode contact, the first color string of LEDs of the plurality of second stings is coupled between the second anode contact and the second cathode contact, the second color string of LEDs of the plurality of first stings is coupled between the third anode contact and the third cathode contact, the second color string of LEDs of the plurality of second stings is coupled between the fourth anode contact and the fourth cathode contact.

9. The solid state lighting tile of claim 8, wherein at least one of the first strings and at least one of the second strings comprises electrical test pads between a pair of adjacent LEDs.

10. The solid state lighting tile of claim 8, further comprising a loopback connector that electrically connects the first cathode contact of the first color string of LEDs of the plurality of first strings to the first anode contact of the first color string LEDs of the plurality of second strings, wherein the loop back connector further electrically connects the second cathode contact of the second color string of LEDs of the plurality of first strings to the second anode contact of the second color string of LEDs of the plurality of second strings.

11. A solid state lighting tile, comprising:
a substrate having a planar surface;
a first set of contact pads on a first end of the substrate and a second set of contact pads on a second end of the substrate, wherein the first set of contact pads comprises a first anode contact, a second cathode contact, a third anode contact and a fourth cathode contact, wherein the second set of contact pads comprises a first cathode contact, a second anode contact, a third cathode contact and a fourth anode contact, wherein the first cathode contact, and wherein the first cathode contact and the second anode contact are between the third cathode contact and the fourth anode contact at the second end of the substrate;
a first plurality of solid state light emitting devices (LEDs) on the substrate, wherein the first plurality of LEDs are connected in series to form a first string of LEDs of a first color, the first string coupled to the first anode contact at the first end of the substrate and coupled to the first cathode contact at a second end of the substrate;
a second plurality of LEDs on the substrate, the second plurality of LEDs connected in series to form a second string of LEDs of the first color, the second string coupled to the second cathode contact at the first end of the substrate and coupled to the second anode contact at the second end of the substrate;
a third plurality of solid state light emitting devices (LEDs) on the substrate, wherein the third plurality of LEDs are connected in series to form a third string of LEDs of a second color different from the first color, the third string coupled to the third anode contact at the first end of the substrate and coupled to the third cathode contact at the second end of the substrate; and a fourth plurality of solid state light emitting devices (LEDs) on the substrate, wherein the fourth plurality of LEDs are connected in series to form a fourth string of LEDs of the second color, the fourth string coupled to the fourth anode contact at the second end of the tile and coupled to the fourth cathode contact at the first end of the substrate.

* * * * *